United States Patent
Stockman

(10) Patent No.: US 7,619,420 B2
(45) Date of Patent: Nov. 17, 2009

(54) CAPACITANCE MEASUREMENT DEVICE

(75) Inventor: Robert M. Stockman, Palm Coast, FL (US)

(73) Assignee: American Radionic Company, Inc., Palm Coast, FL (US)

(*) Notice: Subject to any disclaimer, the term of this patent is extended or adjusted under 35 U.S.C. 154(b) by 0 days.

(21) Appl. No.: 11/621,428

(22) Filed: Jan. 9, 2007

(65) Prior Publication Data
US 2008/0042641 A1  Feb. 21, 2008

Related U.S. Application Data

(60) Provisional application No. 60/839,058, filed on Aug. 21, 2006.

(51) Int. Cl.
*G01R 27/26* (2006.01)
(52) U.S. Cl. .................. 324/663; 324/649; 324/658; 324/674; 361/278; 361/303; 361/329
(58) Field of Classification Search ........... 324/663
See application file for complete search history.

(56) References Cited

U.S. PATENT DOCUMENTS

| | | | |
|---|---|---|---|
| 3,304,473 A | 2/1967 | Netherwood et al. | |
| 3,377,510 A | 4/1968 | Rayno | |
| 3,921,041 A | 11/1975 | Stockman | |
| 4,028,595 A | 6/1977 | Stockman | |
| 4,106,068 A | 8/1978 | Flanagan | |
| 4,112,474 A | 9/1978 | Wilson et al. | |
| 4,209,815 A | 6/1980 | Rollins et al. | |
| 4,240,126 A | 12/1980 | Sanvito | |
| 4,263,638 A | 4/1981 | Stockman et al. | |
| 4,312,027 A | 1/1982 | Stockman | |
| 4,326,237 A * | 4/1982 | Markarian et al. | 361/329 |
| 4,352,145 A | 9/1982 | Stockman | |
| 4,447,854 A | 5/1984 | Markarian | |
| 4,558,394 A | 12/1985 | Stockman | |
| 4,754,361 A | 6/1988 | Venturini | |
| 4,812,941 A | 3/1989 | Rice et al. | |
| 4,825,147 A | 4/1989 | Cook et al. | |
| 4,897,760 A | 1/1990 | Bourbeau | |
| 5,019,934 A | 5/1991 | Bentley et al. | |
| 5,122,733 A | 6/1992 | Havel | |
| 5,138,519 A | 8/1992 | Stockman | |
| 6,084,764 A | 7/2000 | Anderson | |
| 7,203,053 B2 * | 4/2007 | Stockman | 361/301.5 |
| 2004/0100288 A1 * | 5/2004 | Bo | 324/687 |

OTHER PUBLICATIONS

Agilent 4284A/4285A Precision LCR Meter Family Overview, Agilent Technologies, Inc., Printed May 7, 2004.*
Agilent 4284A/4285A Precision LCR Meter Family, Technical Overview, Printed May 2004.*
Agilent Application Note E5250A-3, "Accurate and Efficient C—V Measurements", Copyright 2000, Agilent Technologies, Printed Nov. 2000.*

(Continued)

*Primary Examiner*—Timothy J Dole
*Assistant Examiner*—Benjamin M Baldridge
(74) *Attorney, Agent, or Firm*—Fish & Richardson P.C.

(57) ABSTRACT

An apparatus includes a measurement device for measuring two capacitances. The apparatus also includes a display module that simultaneously displays at least two numerical values based on the measured capacitances.

19 Claims, 8 Drawing Sheets

OTHER PUBLICATIONS

Agilent 4284A/4285A Precision LCR Meter Family, Technical Overview, Printed May 2004 (Reference furnished to applicant in a previous office action).*

Agilent Application Note E5250A-3, "Accurate and Efficient C—V Measurements", Copyright 2000, Agilent Technologies, Printed Nov. 2000 (Reference furnished to applicant in a previous office action).*

PCT International Search Report and Written Opinion, mailed Feb. 8, 2008. 10 pages. International Application No. PCT/US 07/65674 filed Mar. 30, 2007.

American Radionic "American Radionic Introduces Capacitors Without Compromise" (Advertisement); 1989.

* cited by examiner

CAPACITANCE MEASUREMENT DEVICE

CLAIM OF PRIORITY

This application claims priority under 35 USC §119(e) to U.S. Patent Application Ser. No. 60/839,058, filed on Aug. 21, 2006, the entire contents of which are hereby incorporated by reference.

BACKGROUND

This disclosure relates to a capacitance measurement device.

For designing, constructing and testing electronic circuitry, tests may be performed on individual components to check for appropriate component parameters. For example, a multimeter may be used to check the resistance of individual or combinations of resistors. Similarly a capacitance meter may be used to measure the capacitance of individual or combinations of capacitors or other types of electrical devices.

SUMMARY

In general, in one aspect, an apparatus includes a measurement device for measuring two capacitances. The apparatus also includes a display module that simultaneously displays at least two numerical values based on the measured capacitances.

Implementations may include one or more of the following features. The display module may include two or more displays. Various types of information may be presented on the two or more displays. For example, a first display may be configured to present a numerical value representative of the one measured capacitance and a second display may be configured to present a numerical value representative the other measured capacitance. The display module may implement one or more display technologies such as liquid crystal display (LCD) technology, light emitting diode (LED) technology, etc. The apparatus may further include a display driver for processing one of the measured capacitances and for driving the display module to display a numerical value. Various types of processing may be implemented, for example, processing may include assigning a unit of measure to one of the measured capacitances. The apparatus may further include a selector for controlling the device and the display module. For example, the selector may control one or more measurement parameters such as capacitance range. The selector may also control one or more presentation parameters such as display precision.

In general, in another aspect, an apparatus includes one measurement device for measuring a first capacitance and another second measurement device for measuring a second capacitance. The apparatus also includes one display module for displaying a first numerical value that represents the first measured capacitance and a second display module for displaying a second numerical value that represents the second measured capacitance. Both the first and second numerical values are simultaneously displayed. The apparatus also includes one display driver for driving one of the display modules and a second display driver for driving the other display module. A selector included in the apparatus provides data to the first and second display drivers. Two or more ports included in the apparatus respectively connect the one measurement device to a first capacitive element and the second measurement device to a second capacitive element.

Implementations may include one or more of the following features. The two or more ports may include a first port connected to the first measurement device, a second port connected to the second measurement device, and a common port connected to the first and second measurement devices. The selector may control one or more measurement parameters such capacitance range. The selector may also control one or more presentation parameters such as display precision. For example, the selector may control the capacitance range of the first measurement device or the selector may control the displayed precision of the first and second numerical values.

In general, in another aspect, a method includes simultaneously displaying a first numerical value and a second numerical value on a single unit. The unit includes a measurement device for measuring capacitance and a display module. The numerical values respectively represent a first capacitance and a second capacitance measured by the single unit.

Implementations may include one or more of the following features. The method may further include selecting the precision of at least one of the numerical values. The method may also include selecting the capacitance range of the measurement device. The first capacitance may be provided by a first capacitive element under measurement and the second capacitance may be provided by a second capacitor element under measurement. The first capacitive element may be included in an integrated package, such as a Turbo 200™ motor-run capacitor.

In general, in another aspect, a medium bears instructions to cause a machine to simultaneously display a first numerical value and a second numerical value on a single unit that includes a measurement device for measuring capacitance and a display module. The numerical values respectively represent a first capacitance and a second capacitance measured by the single unit.

Implementations may include one or more of the following features. Further instructions may be included to cause the machine to assign a precision of at least one of the numerical values. The first capacitance may be provided by a first capacitive element under measurement and the second capacitance may be provided by a second capacitor element under measurement. One or both of the capacitive elements may be included in an integrated package, such as a Turbo 200™ motor-run capacitor.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
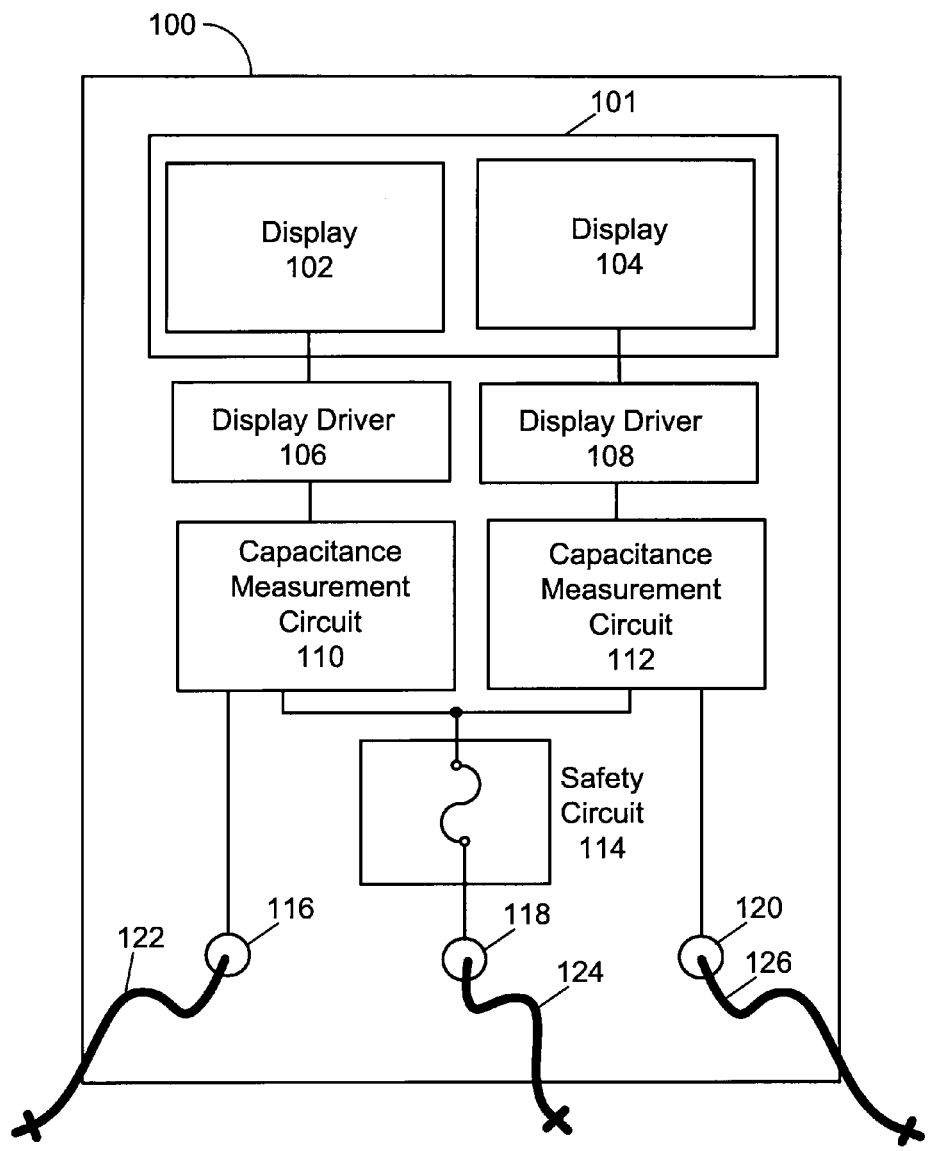
FIG. 1 is a block diagram of a capacitor meter.

Referring to FIG. 1, a block diagram of a capacitor meter 100 capable of simultaneously measuring two capacitors is shown. Additionally, the meter 100 includes a display module 101 that includes two separate displays 102, 104 that may present numerical values representative of the measured capacitance values. One or more display technologies may be incorporated into one or both of the displays. For example, liquid crystal display (LCD) technology, light emitting diode (LED) technology or other similar display technologies may be incorporated into the capacitor meter.

To respectively drive the two displays, two display drivers 106, 108 are included in the meter 100, however, in some arrangements, a single display driver or more than two display drivers may be implemented for driving the displays. One or both of the display drivers 106, 108 may be implemented in hardware or software or a combination of hardware and software.

In this arrangement, capacitance measurements are performed by two capacitance measurement circuits 110, 112. One or more measurement techniques may be used by the capacitance measurement circuits, for example, capacitors under test may be placed in parallel with a capacitor with a known capacitance value. Dependent upon frequency variations of one or more test frequencies, the capacitance of the capacitor under test may be determined. Other capacitance measurement techniques may be implemented separately or in conjunction with comparing a capacitor under test to a known capacitance value, for example.

To collect signals from the two capacitors under test, three test leads 122, 124, 126 are connected to three respective ports 116, 118, 120 included in the meter 100. In this arrangement, one of the three leads (i.e., lead 124) provides a common electrical connection for both of the capacitance measurement circuits 110, 112. Additionally, the common lead 124 is connected to a safety circuit 114 (e.g., a fuse) so that if an electrical fault occurs (e.g., one of the capacitors shorts out) the electrical circuitry of the meter 100 may not be damaged. While this particular arrangement uses one lead to provide a common electrical connection for both capacitance measurements, in other arrangements, two or more common leads may be used for measurements.

In this arrangement one lead 122 is connected to the left side port 116 of the meter 100. The lead 122 may be used in conjunction with one of the capacitance measurement circuits (and the common lead 124) to measure the capacitance of one capacitor under test. For example, the lead 122 and the common lead 124 may be connected to one or more capacitors included in a Turbo200™ or Turbo200X™ motor run capacitor produced by the American Radionic Company, Inc. of Palm Coast, Fla. The measured capacitance of one or more capacitors included in the motor run capacitor may be associated with a particular application such as being used as a replacement capacitor for an air conditioning unit. In such an application, the capacitance connected between the lead 122 and the common lead 124 may be measured for replacing a fan motor capacitor of an air conditioning unit. Similarly the capacitance measure circuit 112 can be used to measure a replacement capacitor for another function of the air conditioning unit. For example, the capacitance measurement circuit 112 via the lead 126 and the common lead 124 may be used for measuring a replacement capacitor for a compressor included in the air conditioning unit.

In some arrangements the capacitance measurement circuits 110 and 112 may implement similar or different capacitance measurement techniques. For example an oscillator may be included in one or both of the capacitance measurement circuits to produce a reference signal (e.g., a resonant frequency signal). Dependent upon this signal and a reference capacitance (included in the respective measurement circuit), capacitors under test may produce a frequency change in the reference signal. By measuring this frequency change, the capacitance of the capacitor under test may be determined. While this technique uses a frequency measurement to determine the capacitance of the capacitor under test, other capacitance measurements may be incorporated into one or both of the capacitance measurement circuits 110, 112.

Upon determining the capacitance of each capacitor under test, representative data may be provided to the display drivers 106, 108. Upon decoding the data, each of the display drivers 106, 108 may respectively provide data to each of the displays 102, 104. For example, the display driver 106 may provide data (to the display 102) that represents the capacitance of a replacement capacitor for the fan of an air conditioning unit. Similarly, the display driver 108 may provide data (to the display 104) that represents the capacitance of a replacement capacitor for a compressor included in the air conditioning unit. By displaying both of these values, a technician is able to simultaneously check both capacitance measurements prior to installing the replacement capacitors. This dual display technique may be extremely helpful for technicians if both replacement capacitors are contained in the same integrated component package. For example, capacitances for a replacement fan capacitor and a replacement compressor capacitor provided by a single Turbo200™ motor run capacitor may be simultaneously displayed. Thereby a technician may check that both capacitance values are appropriate prior to installing the Turbo200™ motor run capacitor in the air conditioning unit. By providing this dual capacitance checking methodology, the probability of installing an incorrect capacitance value may be reduced. For example, by checking both capacitance values, a technician can determine if jumper wires have to be connected to appropriate capacitors in the motor run capacitor.

Figure 2:
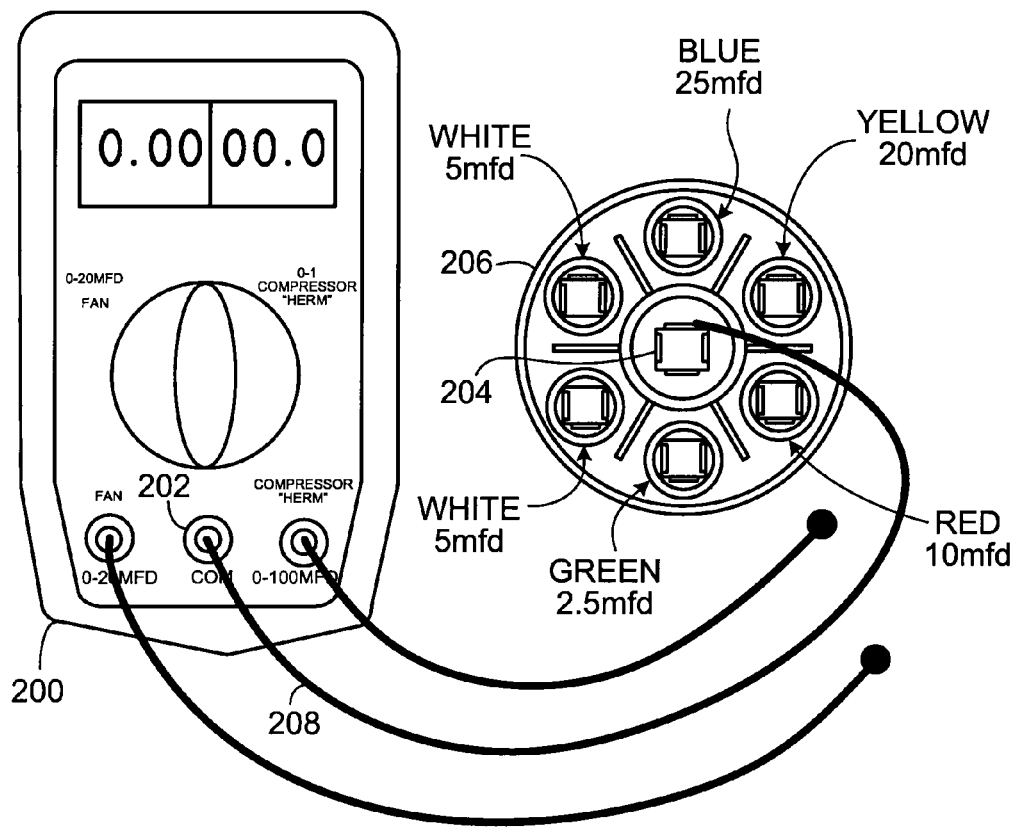
FIGS. 2-7 are a series of diagrams that illustrate measuring two capacitance values provided by a motor run capacitor.

Referring to FIGS. 2-7, a series of diagrams illustrate measuring two capacitance values provided by a motor run capacitor such as a Turbo200™. Referring to FIG. 2, in this example, a capacitance of 7.5 micro-Farad is needed to replace a fan motor capacitor while a capacitance of 55.5 micro-Farad is needed to replace a compressor capacitor of an air conditioning unit. To initiate the measurement, a common port 202 of a dual display capacitance meter 200 is connected to a common connector 204 of a motor run capacitor via a common lead 208. In this arrangement, the motor run capacitor includes six discrete capacitances (e.g., 2.5 micro-Farad, 5 micro-Farad, 5 micro-Farad, 10 micro-Farad, 20 micro-Farad and 25 micro-Farad) that may be used individually or in combination to produce the replacement capacitors (e.g., a fan motor replacement capacitor, a compressor replacement capacitor, etc.). In this implementation a color-coded tab is used identify each discrete capacitance (e.g., a green tab for 2.5 micro-Farad capacitance, white tabs for 5 micro-Farad capacitances, a red tab for a 10 micro-Farad capacitance, a yellow tab for a 20 micro-Farad capacitance, a blue tab for a 25 micro-Farad capacitance).

Figure 3:
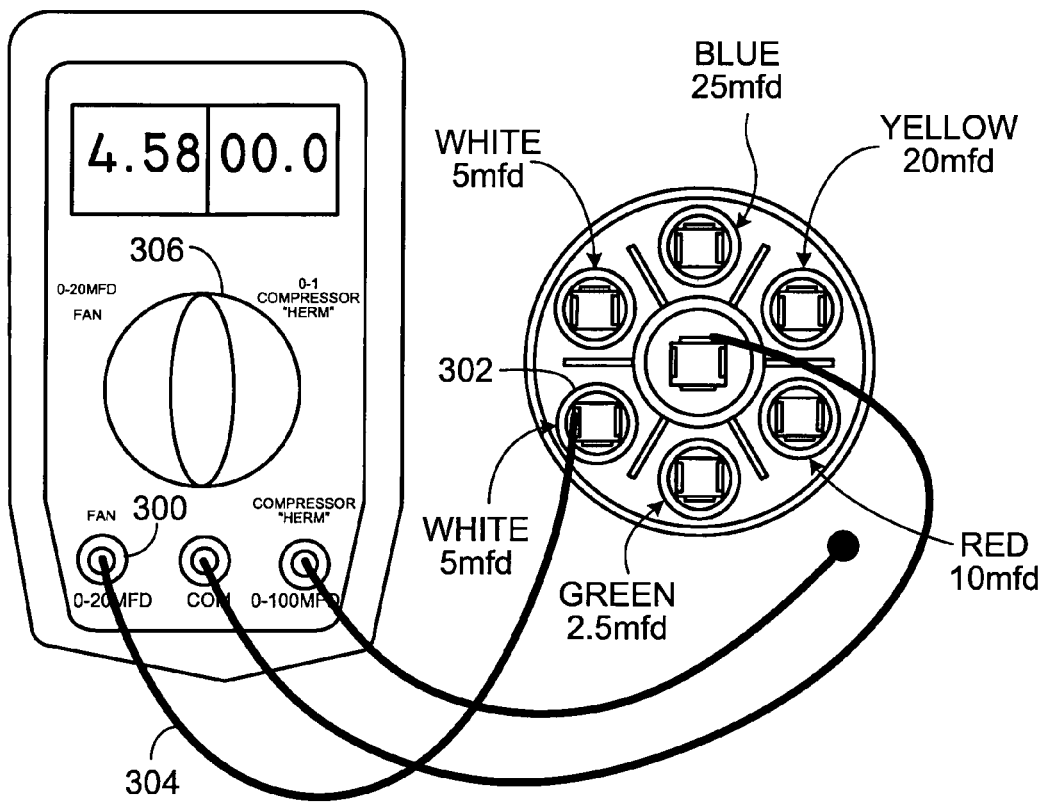

Referring to FIG. 3, to produce the 7.5 micro-Farad capacitance needed for the fan motor replacement capacitor, the 5 micro-Farad capacitor is connected in parallel with one of the 2.5 micro-Farad capacitors, for example. To measure the capacitance of this combination of capacitors, a capacitance measurement port 300 is connected to the 5 micro-Farad capacitor 302 via a lead 304. In this arrangement, the capacitance measurement port 300 is capable of measuring capacitance values in a fixed range between 0 micro-Farad and 20 micro-Farad. While this capacitance range may be typical for fan motors of air conditioning units, in some arrangements, this range may be larger or smaller. Furthermore, the capacitance ranges may extend beyond 20 micro-Farad as an upper limit. Similarly, the lower limit may be larger than 0 micro-Farad. Also, rather than being constrained by a fixed range, the capacitance range may be selectable by a user. For example, a selector 306 included in the meter may be used to select a capacitance range. Other parameters may be selected with use of the selector. For example, display precision (e.g., tenths of micro-Farad, hundredths of a micro-Farad, etc.) may be selected by a user.

Figure 4:
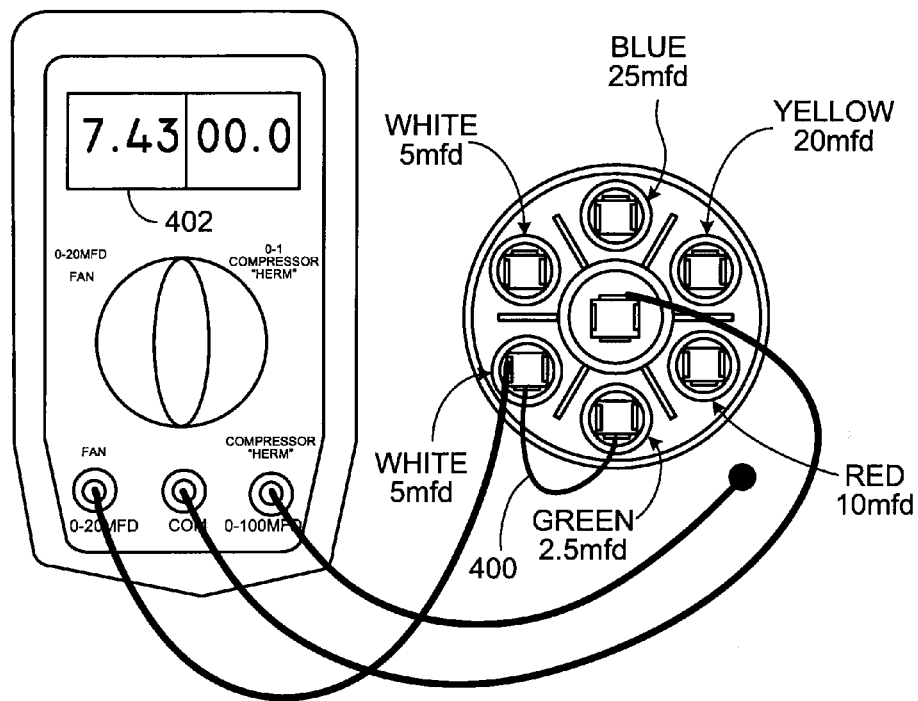

Referring to FIG. 4, to produce the 7.5 micro-Farad fan motor capacitor, a jumper lead 400 connects the 5 micro-Farad capacitor to the 2.5 micro-Farad capacitor. Based upon this connection, the measured capacitance value increases from 4.58 micro-Farad (shown in FIG. 3) to 7.43 micro-Farad as shown in a left hand side display 402. Due to tolerance levels, the measured capacitance may not exactly match the numerical sum of the capacitance values. In this example, the capacitance sum of the capacitors is 7.5 micro-Farad while the measured capacitance value is 7.43 micro-Farad. Dependent upon the use of this combination of capacitors, this capacitance may or may not be within an acceptable tolerance.

Figure 5:
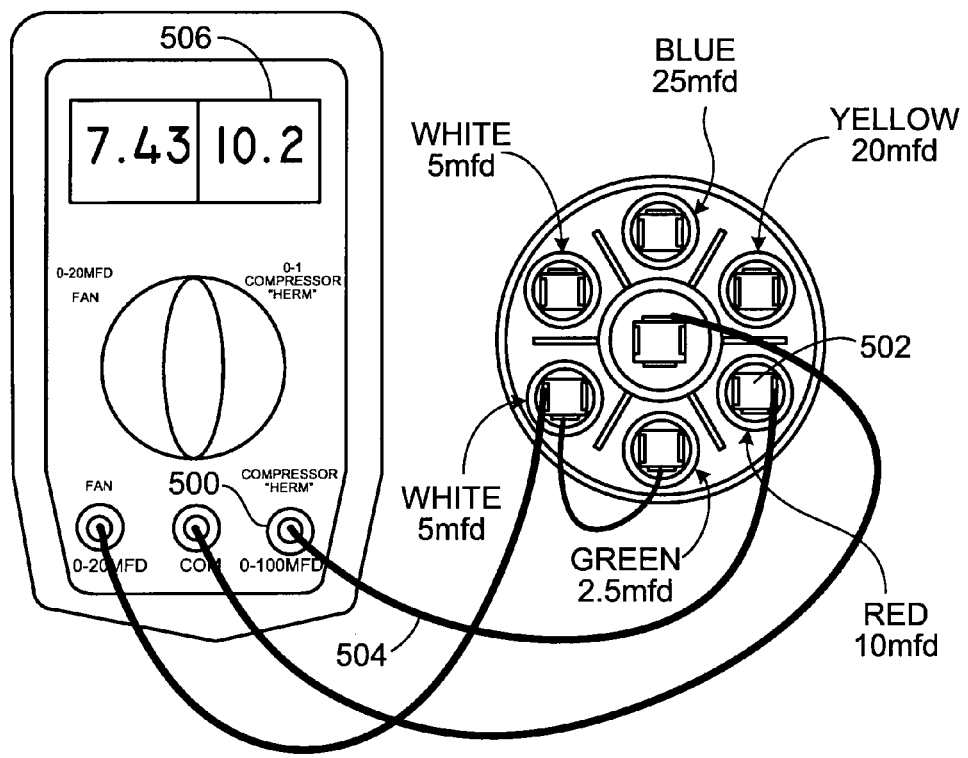

Referring to FIG. 5, a meter port 500 for measuring a compressor replacement capacitor is connected to a connector 502 of a 10 micro-Farad capacitor included in the motor capacitor, via a lead 504. As shown in a right-hand side display 506, a numerical value of 10.2 micro-Farad is presented to represent the measured capacitance of the 10 micro-Farad capacitor.

Figure 6:
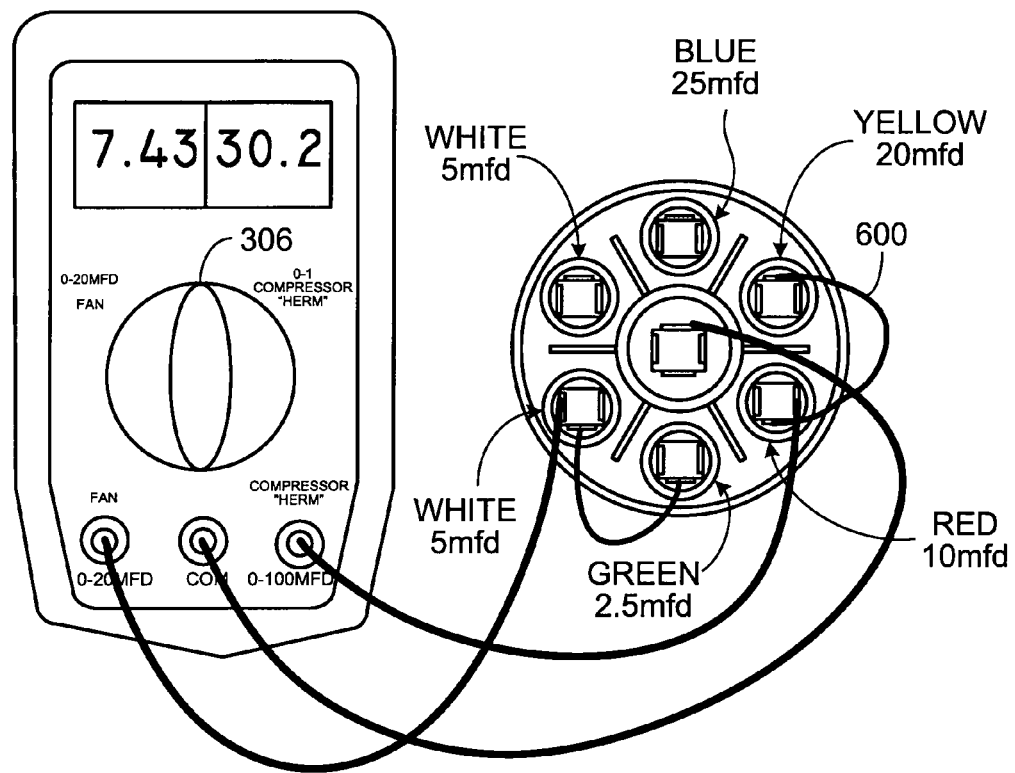

Referring to FIG. 6, a jumper lead 600 is used to connect the 10 micro-Farad capacitor in parallel with a 20 micro-Farad capacitor included in the motor run capacitor. As shown by the right-hand side display, the measured capacitance has increased to 30.2 micro-Farad corresponding to connecting the 20 micro-Farad and 10 micro-Farad capacitors in parallel. Comparing the left-hand display and the right-hand display, each display is presenting data with different precision. In particular, the left-hand display is presenting data in hundredths of a micro-Farad while the right-hand display is presenting data in tenths of a micro-Farad. However, in some arrangements, both displays may present data with equivalent levels of precision. Furthermore, besides presenting data with precision in the hundredths or tenths of a micro-Farad, in some arrangements, data may be presented with more or less precisions (e.g., thousandths of a micro-Farad). The precision displayed may be selected by a user via the selector 306.

Figure 7:
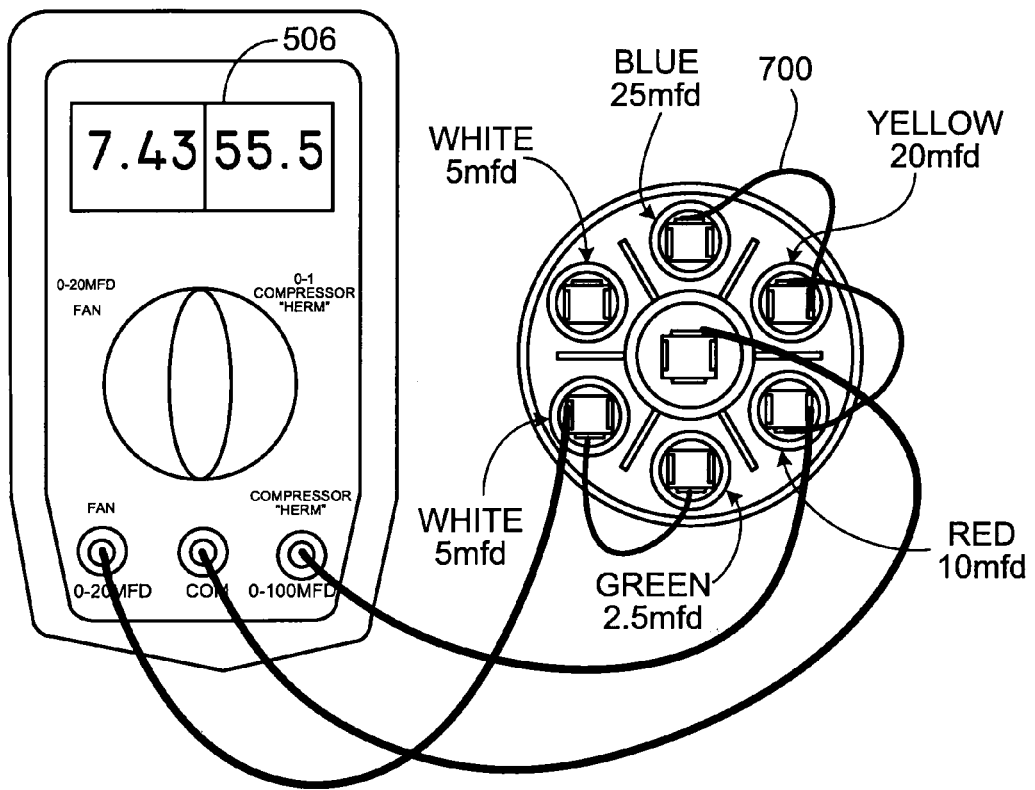

Referring to FIG. 7, to complete combining capacitors to provide 55 micro-Farad, another jumper 700 connects a 25 micro-Farad capacitor in parallel to the parallel combination of the 20 micro-Farad capacitor and the 10 micro-Farad capacitor. Correspondingly, the right-hand display 506 of the dual capacitor meter presents the numerical value (e.g., 55.5 micro-Farad) that represents the combined capacitance of the parallel connected capacitors.

Each of the capacitance meters described in FIGS. 2-7 includes a button labeled "power", a button labeled "hold", and a circular selector switch. As suggested by the label, the power button allows a technician to turn the meter on or off. By pressing the hold button, in some arrangements, data currently being presented in both displays continues to be presented until an event is detected (e.g., pressing the hold button for a second time). By holding the data being presented, a technician is allowed to change lead connections (e.g., disconnect one or more leads) without losing the data being presented on the displays.

In some arrangements the circular selector may be used to change measurement parameters such as the capacitance range being used by one or more capacitance measurement circuits. The circular selector may also be used to change presentation parameters of one or both of the displays. For example, the precision of the numerical values displayed on one or both of the displays may be controlled by the circular selector.

Other features may also be incorporated into the dual display capacitance meter. For example, various network connections (e.g., wireless connections, hardwire connections, etc) may be incorporated into the dual display meter. By incorporating network technology into the meter, data may be passed between the meter and other digital devices (e.g., computer systems, cellular phones, etc.) by using one or more network protocols or other similar networking techniques.

Figure 8:
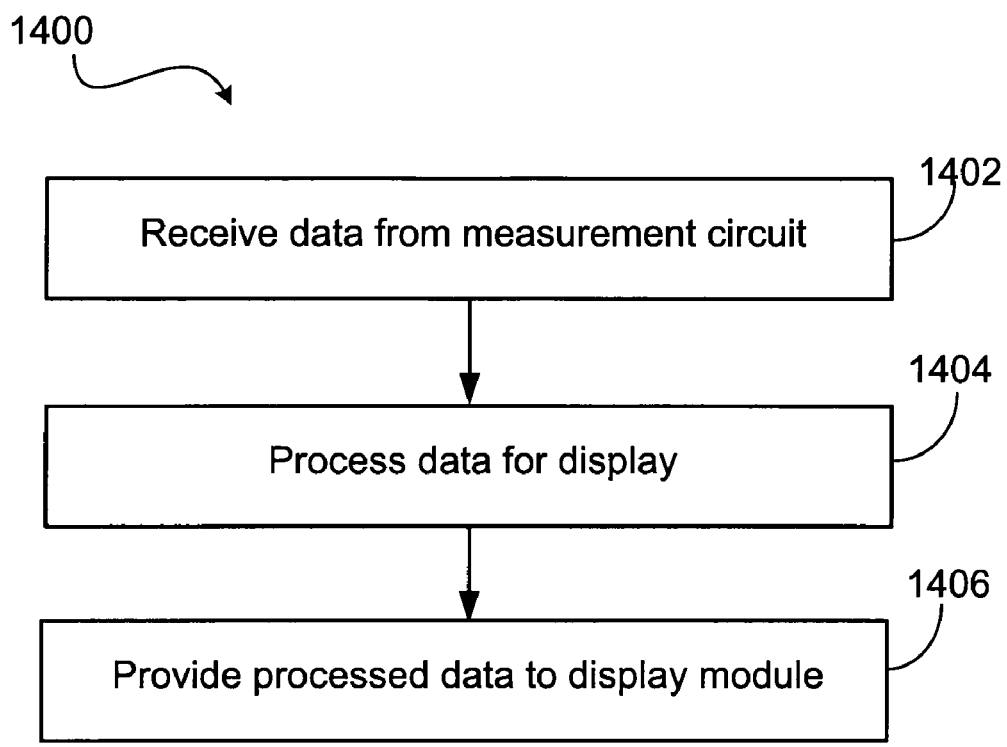
FIG. 8 is a flow chart of operations of a display driver.

Referring to FIG. 8, a flowchart 1400 that represents some of the operations of one or both of the display drivers 106, 108 is shown. Operations of the display drivers 106, 108 may be provided by one or more processors such as general purpose processors (e.g., a microprocessor) or specialized processors or other type of electrical circuitry (e.g., analog circuitry, digital circuitry, etc.). Also, operations for display drivers 106 and 108 may be executed separately or jointly by one or more processors or electrical circuits.

The operations represented in flowchart 1400 are described below with respect to display driver 106, however, the flowchart may also represent operations of the display driver 108 or other similar type of display driver. Operations of the display driver 106 include receiving 1402 data from a measurement circuit such as capacitance measurement circuit 110. The received data may be provided in one or more forms such as an analog signal, a digital signal or combination thereof. Operations also include processing 1404 the received data in preparation of displaying the data. For example, the data may be converted from a format native to the measurement circuit into a format recognizable by a display module. Conversions may be based upon data provided by other portions of the capacitance meter. For example, the position of a selector located on the outer face of the capacitance meter may provide data pertinent to the display data. Numerical precision, measurement range, capacitance units (e.g., micro-Farads, pico-Farads, etc.) may be represented by the position of one or more selectors. This data may also be provided from a data storage device (e.g., memory, magnetic media, etc.) included in the capacitance meter. Other processing operations may include calibrating the measurement data. For example, data representative of measurement variations from standard (e.g., a capacitor with known capacitance) may be applied to the measurement data for calibration. Other processing techniques such as data averaging and calculating higher order statistics may be performed for application to the measurement data or other data.

Operations may also include providing 1406 the processed data to a display module. For example, the display driver 106 may provide data to display module 101 for presentation on the display 102. The provided data may comply with one or more formats (e.g., signal level, protocols, etc.) such that the data is recognizable by the display module. The operations presented in the flow chart may be executed in a repetitive manner so that the display is rapidly refreshed. In some implementations, execution of the operations may be multiplexed with the execution of other operations (e.g., operations of another display driver).

In some embodiments one or more processors may execute instructions to perform the operations of the display driver 106, e.g., represented in flowchart 1400. For example, one or more general processors (e.g., a microprocessor) and/or one or more specialized devices (e.g., an application specific integrated circuit (ASIC), etc.) may execute instructions. One or more of the processors may be implemented in a single integrated circuit as a monolithic structure or in a distributed structure. In some embodiments the instructions that are executed by the processors may reside in a memory (e.g., random access memory (RAM), read-only memory (ROM), static RAM (SRAM), etc.). The instructions may also be stored on one or more mass storage devices (e.g., magnetic, magneto-optical disks, or optical disks, etc.).

One or more of the operations associated with the display driver 106 may be performed by one or more programmable processors (e.g., a microprocessor, an ASIC, etc.) executing a computer program. The execution of one or more computer programs may include operating on input data (e.g., measurement data, a selector position, etc.) and generating output (e.g., providing display data on an output port, etc.). The operations may also be performed by a processor implemented as special purpose logic circuitry (e.g., an FPGA (field programmable gate array), an ASIC (application-specific integrated circuit), etc.).

Operation execution may also be executed by digital electronic circuitry, or in computer hardware, firmware, software, or in combinations of them. The operations described in flowchart 1400 may be implemented as a computer program product, e.g., a computer program tangibly embodied in an information carrier, e.g., in a machine-readable storage device (e.g., RAM, ROM, hard-drive, CD-ROM, etc.) or in a propagated signal. The computer program product may be executed by or control the operation of, data processing apparatus, e.g., a programmable processor, a computer, or multiple computers. A computer program may be written in one or more forms of programming languages, including compiled or interpreted languages, and it can be deployed in any form, including as a stand-alone program or as a module, component, subroutine, or other unit suitable for use in a computing environment. A computer program may be deployed to be executed on one computing device (e.g., controller, computer system, etc.) or on multiple computing devices (e.g., multiple controllers) at one site or distributed across multiple sites and interconnected by a communication network.

A number of embodiments of the invention have been described. Nevertheless, it will be understood that various modifications may be made without departing from the spirit and scope of the invention. Accordingly, other embodiments are within the scope of the following claims.

What is claimed is:

1. An apparatus comprising:
a single measurement device for simultaneously measuring a first capacitance and a second capacitance;
a display module for simultaneously displaying at least a first numerical value based on the first measured capacitance and a second numerical value based on the second measured capacitance,
wherein the first measured capacitance is provided by a first portion of a motor run capacitor, the second measured capacitance is provided by a second portion of the motor run capacitor, and the first measured capacitance and the second measured capacitance are different;
a selector for establishing a first range of measurable capacitances for the first measured capacitance and establishing a second range of measurable capacitances for the second measured capacitance;
the selector being further operable to select a first precision for the first numerical value and a second precision for the second numerical value;
a common port used in measuring the first measured capacitance and the second measured capacitance;
a common lead connected to the common port and configured to attach to a common connector of the motor run capacitor;
a first port used in measuring the first measured capacitance;
a first lead connected to the first port and configured to attach to the first portion of the motor run capacitor;
a second port used in measuring the second measured capacitance;
a second lead connected to the second port and configured to attach to a second portion of the motor run capacitor; and
a safety circuit connected to the common port, wherein the safety circuit includes a fuse.

2. The apparatus of claim 1, wherein the display module comprises at least two displays.

3. The apparatus of claim 2, wherein a first of the at least two displays is configured to present a numerical value representative of the first capacitance.

4. The apparatus of claim 3, wherein a second of the at least two displays is configured to present a numerical value representative of the second capacitance.

5. The apparatus of claim 1, wherein the display module comprises a liquid crystal display.

6. The apparatus of claim 1, wherein the display module comprises a light emitting diode.

7. The apparatus of claim 1, further comprising:
a display driver for processing the first measured capacitance and driving the display module to display one of the numerical values.

8. The apparatus of claim 7, wherein the processing comprises assigning a unit of measure to the first measured capacitance.

9. The apparatus of claim 1, further comprising:
a selector for controlling the measurement device and display module.

10. The apparatus of claim 9, wherein the selector controls a capacitance range.

11. The apparatus of claim 9, wherein the selector controls display precision.

12. An apparatus comprising:
a single measurement device comprising:
a first measurement module for measuring a first capacitance provided by a first portion of a motor run capacitor and
a second measurement module for measuring a second capacitance provided by a second portion of the motor run capacitor, the second capacitance different from the first capacitance, wherein the first capacitance and the second capacitance are respectively measured in a substantially simultaneous manner by the first measurement module and the second measurement module;
a first display module for displaying a first numerical value representative of the first measured capacitance;
a second display module for displaying a second numerical value representative of the second measured capacitance, wherein the first and second numerical values are simultaneously displayed;
a first display driver for driving the first display module to display the first numerical value;
a second display driver for driving the second display module to display the second numerical value;
a selector for providing data to the first and second display drivers and for establishing a range of measurable capacitances for the first measurement module and the second measurement module;
a first port and a second port, the first port connected to a first lead for connecting the first measurement module to the first portion of the motor run capacitor and the second port connected to a second lead for connecting the second measurement device to the second portion of the motor run capacitor;

at least one common port connected to a common lead for connecting to a common connector of the motor run capacitor and used in measuring the first capacitance and the second capacitance; and a safety circuit connected to the at least one common port, wherein the safety circuit includes a fuse.

13. The apparatus of claim 12, wherein the at least two ports comprise:

a first port connected to the first measurement module;

a second port connected to the second measurement module; and a common port connected to the first and second measurement modules.

14. The apparatus of claim 12, wherein the selector further controls the capacitance range of the first measurement module.

15. The apparatus of claim 12, wherein the selector controls the displayed precision of the first and second numerical values.

16. A method comprising:

connecting a first lead to at least a portion of a motor run capacitor, the first lead connected to a first port of a single measurement device;

connecting a second lead to a second portion of the motor run capacitor, the second lead connected to a second port of the single measurement device;

connecting a common lead to a common connector of a motor run capacitor, the common lead connected to a common port of the single measuring device;

wherein the common port is connected to a safety circuit, the safety circuit including a fuse;

simultaneously displaying a first numerical value and a second numerical value on a single unit that includes a measurement device for measuring capacitance and a display module, wherein the numerical values respectively represent a first capacitance measured from first portion of the motor run capacitor and a second capacitance measured from the second portion of the motor run capacitor, different from the first capacitance, measured in a substantially simultaneous manner by the single unit; and establishing a selected range of measurable capacitances for the first capacitance and the second capacitance, wherein the measurement device contains at least one common port used in measuring the first capacitance and the second capacitance.

17. The method of claim 16, further comprising:

selecting the precision of at least one of the numerical values.

18. The method of claim 16, further comprising:

selecting the capacitance range of the device.

19. The method of claim 16, wherein the first capacitance is provided by a first capacitive element under measurement and the second capacitance is provided by a second capacitor element under measurement.

* * * * *